US009165940B2

(12) United States Patent
Chien et al.

(10) Patent No.: US 9,165,940 B2
(45) Date of Patent: *Oct. 20, 2015

(54) THREE DIMENSIONAL NAND DEVICE WITH SILICIDE CONTAINING FLOATING GATES AND METHOD OF MAKING THEREOF

(71) Applicant: SANDISK TECHNOLOGIES INC., Plano, TX (US)

(72) Inventors: Henry Chien, San Jose, CA (US); Johann Alsmeier, San Jose, CA (US); George Samachisa, San Jose, CA (US); Henry Chin, Palo Alto, CA (US); George Matamis, Danville, CA (US); Yuan Zhang, San Jose, CA (US); James Kai, Santa Clara, CA (US); Vinod Purayath, Santa Clara, CA (US); Donovan Lee, Santa Clara, CA (US)

(73) Assignee: SANDISK TECHNOLOGIES INC., Plano, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/539,811

(22) Filed: Nov. 12, 2014

(65) Prior Publication Data
US 2015/0072488 A1    Mar. 12, 2015

Related U.S. Application Data

(60) Division of application No. 14/190,974, filed on Feb. 26, 2014, now Pat. No. 8,928,061, which is a
(Continued)

(51) Int. Cl.
*H01L 21/336* (2006.01)
*H01L 27/115* (2006.01)
(Continued)

(52) U.S. Cl.
CPC .... *H01L 27/11556* (2013.01); *H01L 21/28273* (2013.01); *H01L 21/32053* (2013.01);
(Continued)

(58) Field of Classification Search
CPC ............... H01L 27/11548; H01L 27/11551; H01L 27/11556; H01L 27/11575; H01L 27/11578; H01L 27/11582; H01L 29/42332; H01L 29/7881; H01L 29/792; H01L 29/7926; H01L 27/0688; H01L 27/1157
USPC ......... 438/216, 257–259, 593, 264, 268, 278; 257/213, 316, 319, 314, 331, 324–326, 257/393
See application file for complete search history.

(56) References Cited

U.S. PATENT DOCUMENTS

| 5,084,417 A | 1/1992 | Joshi et al. |
| 5,583,360 A | 12/1996 | Roth et al. |

(Continued)

FOREIGN PATENT DOCUMENTS

WO    WO02/15277 A2    2/2002

OTHER PUBLICATIONS

Tanaka et al., "Bit-Cost Scalable Technology for Low-Cost and Ultrahigh-Density Flash Memory," Toshiba Review, vol. 63, No. 2, 2008, pp. 28-31.

(Continued)

*Primary Examiner* — Dung Le
(74) *Attorney, Agent, or Firm* — The Marbury Law Group PLLC

(57) ABSTRACT

A method of making a monolithic three dimensional NAND string, including providing a stack of alternating first material layers and second material layers different from the first material layer over a substrate, the stack comprising at least one opening containing a charge storage material comprising a silicide layer, a tunnel dielectric on the charge storage material in the at least one opening, and a semiconductor channel on the tunnel dielectric in the at least one opening, selectively removing the second material layers without removing the first material layers from the stack and forming control gates between the first material layers.

20 Claims, 11 Drawing Sheets

Related U.S. Application Data continuation-in-part of application No. 14/051,627, filed on Oct. 11, 2013, now Pat. No. 8,765,543, and a continuation-in-part of application No. 13/762,988, filed on Feb. 8, 2013, said application No. 14/051,627 is a division of application No. 13/875,854, filed on May 2, 2013, now Pat. No. 8,580,639, which is a division of application No. 13/693,337, filed on Dec. 4, 2012, now Pat. No. 8,461,000, which is a division of application No. 12/827,761, filed on Jun. 30, 2010, now Pat. No. 8,349,681.

(60) Provisional application No. 61/862,912, filed on Aug. 6, 2013.

(51) Int. Cl.

| | | |
|---|---|---|
| H01L 29/66 | (2006.01) | |
| H01L 29/788 | (2006.01) | |
| H01L 29/792 | (2006.01) | |
| H01L 21/28 | (2006.01) | |
| H01L 21/3205 | (2006.01) | |
| H01L 29/49 | (2006.01) | |

(52) U.S. Cl.
CPC .... *H01L27/11551* (2013.01); *H01L 27/11578* (2013.01); *H01L 27/11582* (2013.01); *H01L 29/495* (2013.01); *H01L 29/4925* (2013.01); *H01L 29/66825* (2013.01); *H01L 29/66833* (2013.01); *H01L 29/7889* (2013.01); *H01L 29/7926* (2013.01)

(56) References Cited

U.S. PATENT DOCUMENTS

| | | | |
|---|---|---|---|
| 5,807,788 | A | 9/1998 | Brodsky et al. |
| 5,897,354 | A | 4/1999 | Kachelmeier |
| 5,915,167 | A | 6/1999 | Leedy |
| 6,238,978 | B1 | 5/2001 | Huster |
| 6,953,697 | B1 | 10/2005 | Castle et al. |
| 7,005,350 | B2 | 2/2006 | Walker et al. |
| 7,023,739 | B2 | 4/2006 | Chen et al. |
| 7,177,191 | B2 | 2/2007 | Fasoli et al. |
| 7,221,588 | B2 | 5/2007 | Fasoli et al. |
| 7,233,522 | B2 | 6/2007 | Chen et al. |
| 7,514,321 | B2 | 4/2009 | Mokhlesi et al. |
| 7,575,973 | B2 | 8/2009 | Mokhlesi et al. |
| 7,745,265 | B2 | 6/2010 | Mokhlesi et al. |
| 7,745,312 | B2 | 6/2010 | Herner et al. |
| 7,808,038 | B2 | 10/2010 | Mokhlesi et al. |
| 7,848,145 | B2 | 12/2010 | Mokhlesi et al. |
| 7,851,851 | B2 | 12/2010 | Mokhlesi et al. |
| 8,008,710 | B2 | 8/2011 | Fukuzumi et al. |
| 8,008,722 | B2 * | 8/2011 | Kim et al. ............ 257/347 |
| 8,187,936 | B2 | 5/2012 | Alsmeier et al. |
| 8,193,054 | B2 | 6/2012 | Alsmeier |
| 8,198,672 | B2 | 6/2012 | Alsmeier |
| 8,237,213 | B2 | 8/2012 | Liu |
| 8,283,228 | B2 | 10/2012 | Alsmeier |
| 8,349,681 | B2 | 1/2013 | Alsmeier et al. |
| 8,445,347 | B2 | 5/2013 | Alsmeier |
| 8,461,000 | B2 | 6/2013 | Alsmeier et al. |
| 8,580,639 | B2 | 11/2013 | Alsmeier et al. |
| 8,765,543 | B2 | 7/2014 | Alsmeier et al. |
| 8,829,591 | B2 | 9/2014 | Alsmeier |
| 2007/0210338 | A1 | 9/2007 | Orlowski |
| 2007/0252201 | A1 | 11/2007 | Kito et al. |
| 2008/0173928 | A1 | 7/2008 | Arai et al. |
| 2009/0283819 | A1 | 11/2009 | Ishikawa et al. |
| 2009/0294828 | A1 | 12/2009 | Ozawa et al. |
| 2010/0044778 | A1 | 2/2010 | Seol et al. |
| 2010/0112769 | A1 | 5/2010 | Son et al. |
| 2010/0120214 | A1 | 5/2010 | Park et al. |
| 2010/0155810 | A1 | 6/2010 | Kim et al. |
| 2010/0155818 | A1 | 6/2010 | Cho et al. |
| 2010/0181610 | A1 | 7/2010 | Kim et al. |
| 2010/0207195 | A1 | 8/2010 | Fukuzumi et al. |
| 2010/0213527 | A1 | 8/2010 | Shim et al. |
| 2010/0320528 | A1 | 12/2010 | Jeong et al. |
| 2011/0076819 | A1 | 3/2011 | Kim et al. |
| 2011/0133606 | A1 | 6/2011 | Yoshida et al. |
| 2011/0266606 | A1 | 11/2011 | Park et al. |
| 2012/0001247 | A1 | 1/2012 | Alsmeier |
| 2012/0001249 | A1 | 1/2012 | Alsmeier |
| 2012/0012921 | A1 | 1/2012 | Liu |
| 2013/0237024 | A1 | 9/2013 | Alsmeier et al. |
| 2013/0248974 | A1 | 9/2013 | Alsmeier et al. |
| 2013/0264631 | A1 | 10/2013 | Alsmeier et al. |
| 2013/0313627 | A1 | 11/2013 | Lee et al. |
| 2014/0008714 | A1 | 1/2014 | Makala et al. |
| 2014/0131787 | A1 | 5/2014 | Alsmeier |
| 2014/0175530 | A1 | 6/2014 | Chien et al. |
| 2014/0252452 | A1 | 9/2014 | Alsmeier |

OTHER PUBLICATIONS

Masahide Kimura, "3D Cells Make Terabit NAND Flash Possible," Nikkei Electronics Asia, Sep. 17, 2009, 6pgs.

Jang et al., "Memory Properties of Nickel Silicide Nanocrystal Layer for Possible Application to Nonvolatile Memory Devices," IEEE Transactions on Electron Devices, vol. 56, No. 12, Dec. 2009.

Chen et al., "Reliability Characteristics of NiSi Nanocrystals Embedded in Oxide and Nitride Layers for Nonvolatile Memory Application," Applied Physics Letters 92, 152114 (2008).

J. Ooshita, Toshiba Announces 32Gb 3D-Stacked Multi-Level NAND Flash, 3 pages, http://techon.nikkeibp.co/jp/english/NEWS_EN/20090619/171977/ Nikkei Microdevices, Tech-On, Jun. 19, 2009.

Wang et al., "Low Temperature Silicon Selective Epitaxial Growth (SEG) and Phosphorous Doping in a Reduced-Pressure Pancake Reactor", ECE Technical Reports, Paper 299 (Apr. 1, 1992).

Whang et al., "Novel 3-Dimensional Dual Control-Gate with Surrounding Floating-Gate (DC-SF) NAND Flash Cell for 1Tb File Storage Application", IEDM-2010 Proceedings, Dec. 6-8, 2010, pp. 668-671.

International Search Report & Written Opinion, PCT/US2011/042566, Jan. 17, 2012.

Invitation to Pay Additional Fees and Partial International Search Report, PCT/US2011/042566, Sep. 28, 2011.

Endoh et al., "Novel Ultra High Density Memory with a Stacked-Surrounding Gate Transistor (S-SGT) Structured Cell," IEDM Proc., (2001), 33-36.

Katsumata et al., "Pipe-shaped BiCS Flash Memory with 16 Stacked Layers and Multi-Level-Cell Operation for Ultra High Density Storage Devices," 2009 Symposium on VLSI Technology Digest of Technical Papers, pp. 136-137.

Maeda et al., "Multi-Stacked 1G Cell/Layer Pipe-shaped BiCS Flash Memory," 2009 Symposium on VLSI Technology Digest of Technical Papers, pp. 22-23.

Jang et al., "Vertical Cell Array Using TCAT (Terabit Cell Array Transistor) Technology for Ultra High Density NAND Flash Memory," 2009 Symposium on VLSI Technology Digest of Technical Papers, pp. 192-193.

International Preliminary Report on Patentability, PCT/US2011/042566, Jan. 17, 2013.

Au et al., "Filling Narrow Trenches by Iodine-Catalyzed CVD of Copper and Manganese on Manganese Nitride Barrier/Adhesion Layers," Journal of the Electrochemical Society, 158(5) (2011).

Kim et al., "Direct Copper Electroless Deposition on a Tungsten Barrier Layer for Ultralarge Scale Integration," Journal of the Electrochemical Society, vol. 152, Issue 2, 2005.

U.S. Appl. No. 14/464,385, filed Aug. 20, 2014, SanDisk Technologies, Inc.

First Office Action of Chinese Patent Application No. 201180030053.2, dated Nov. 20, 2014, (11 pages).

\* cited by examiner

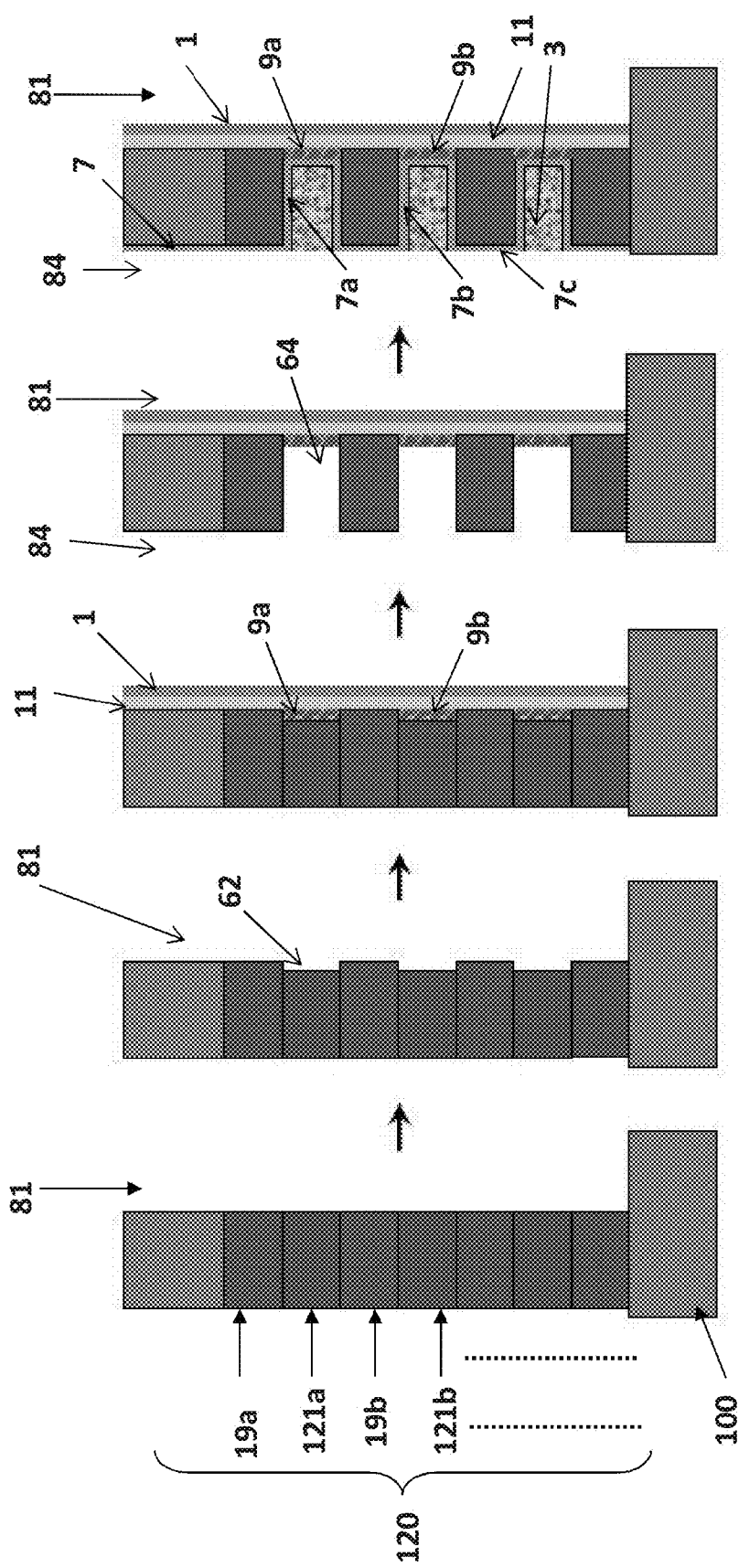

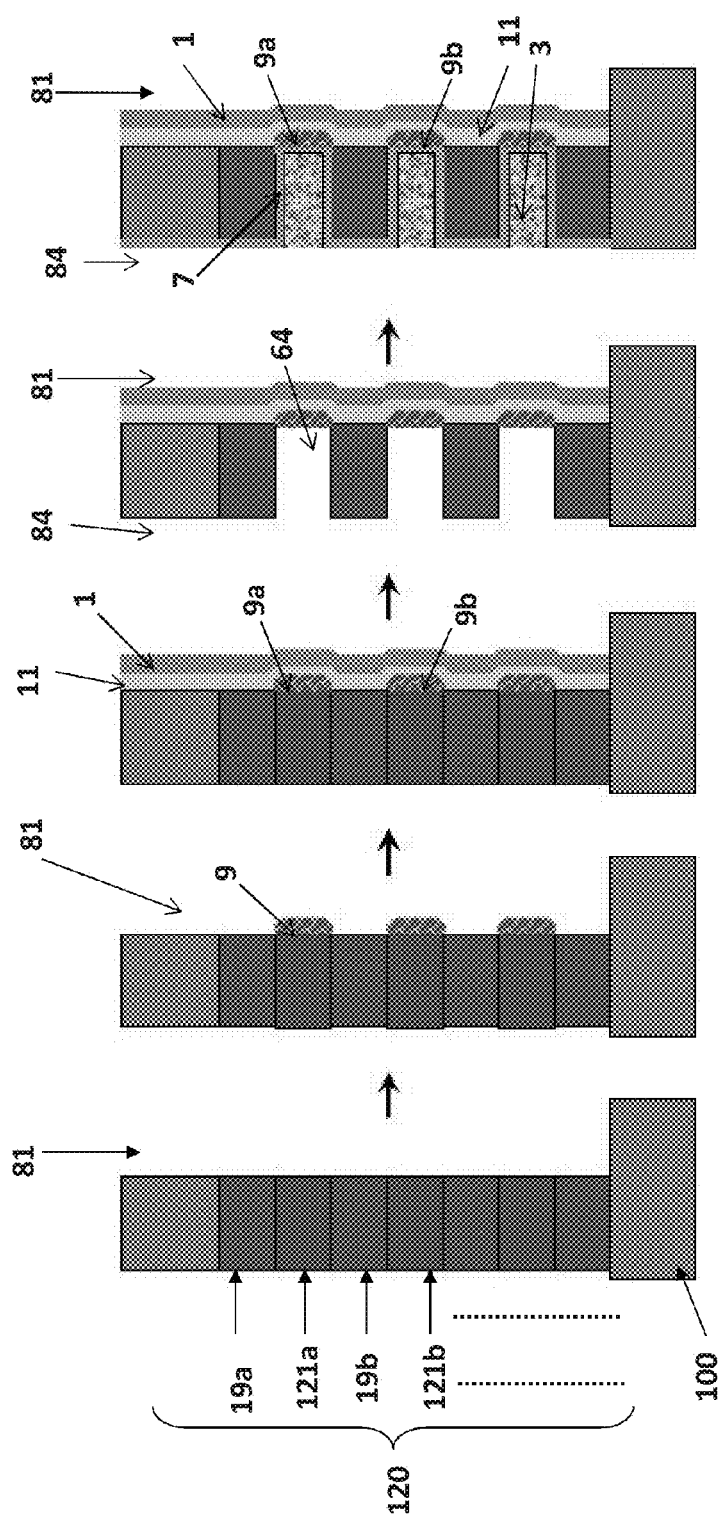

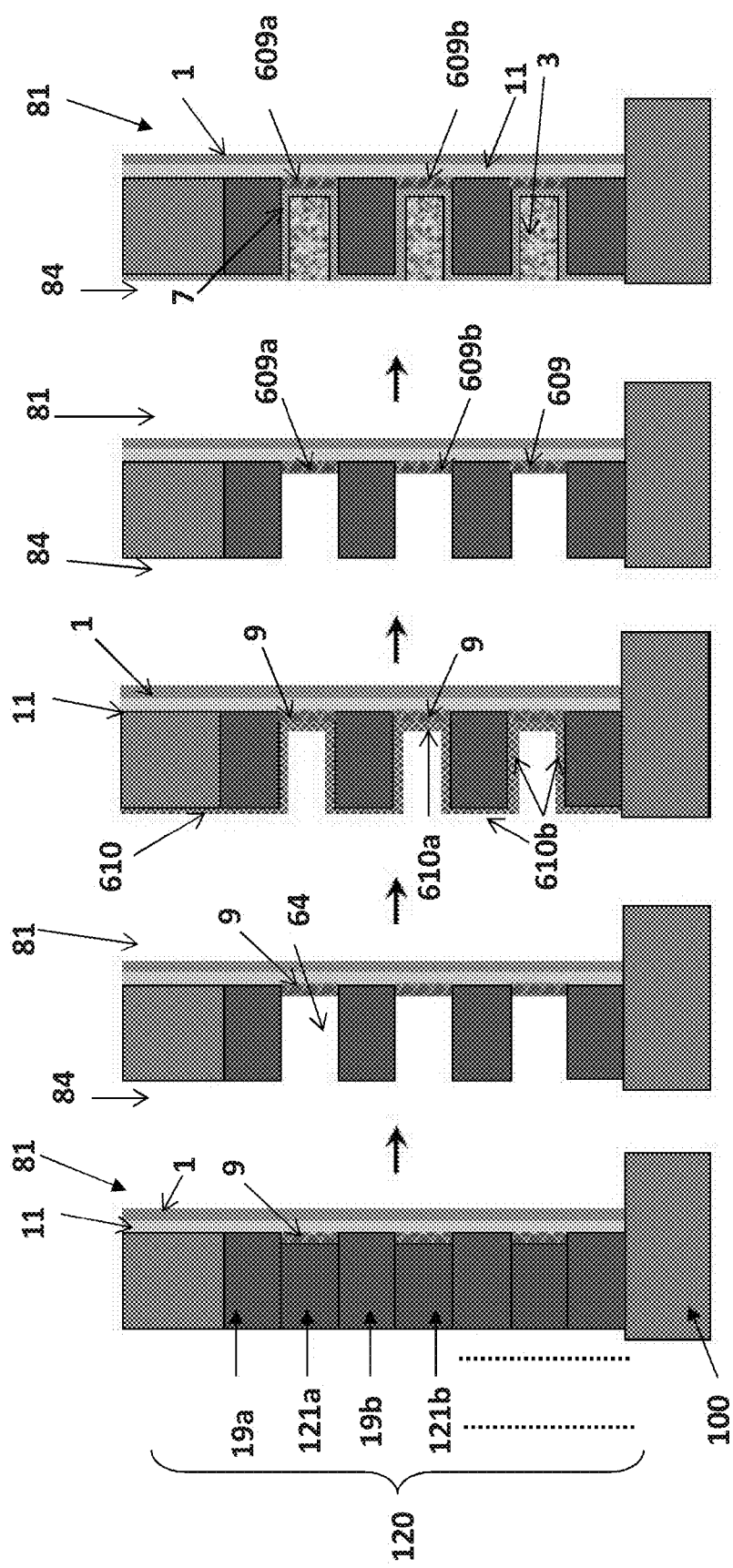

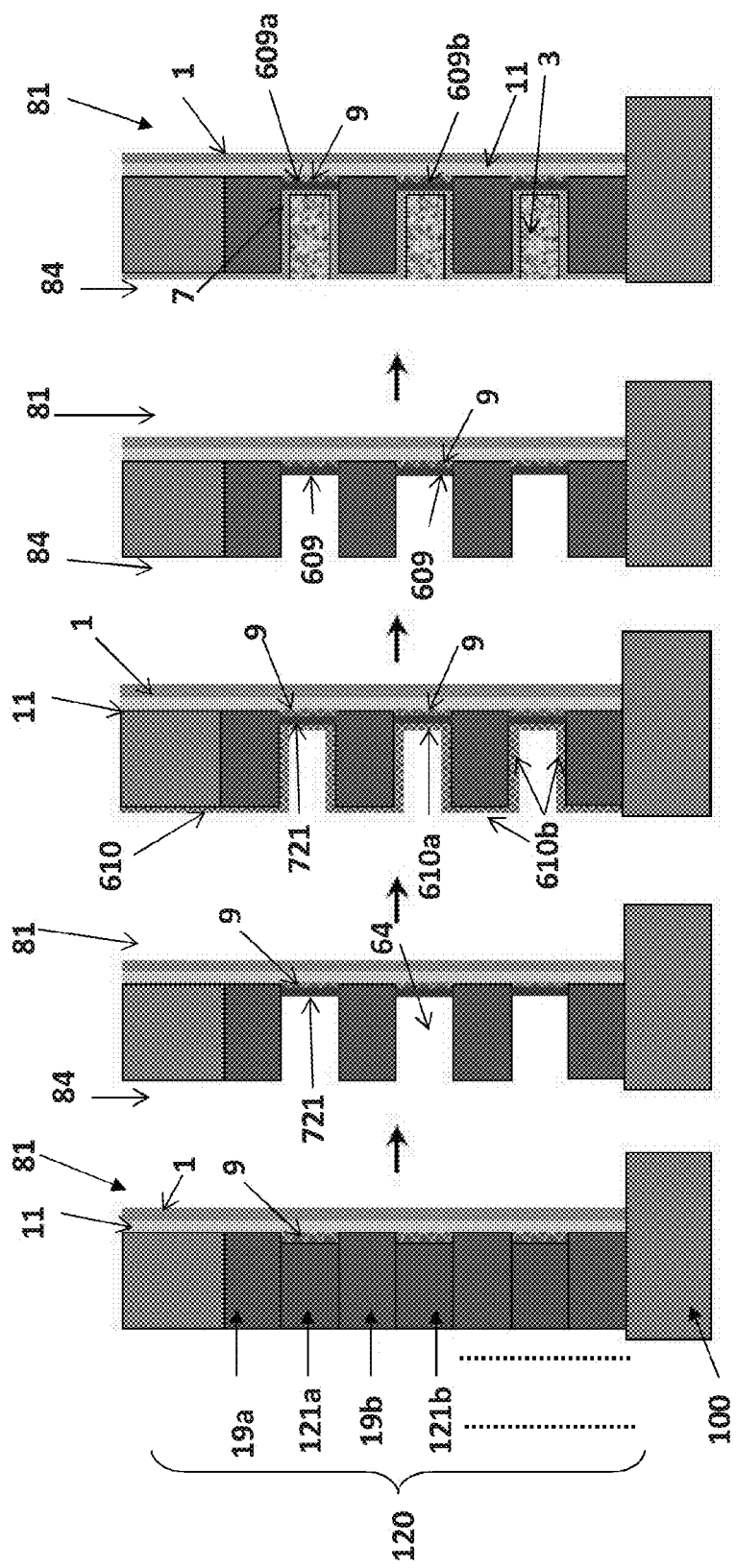

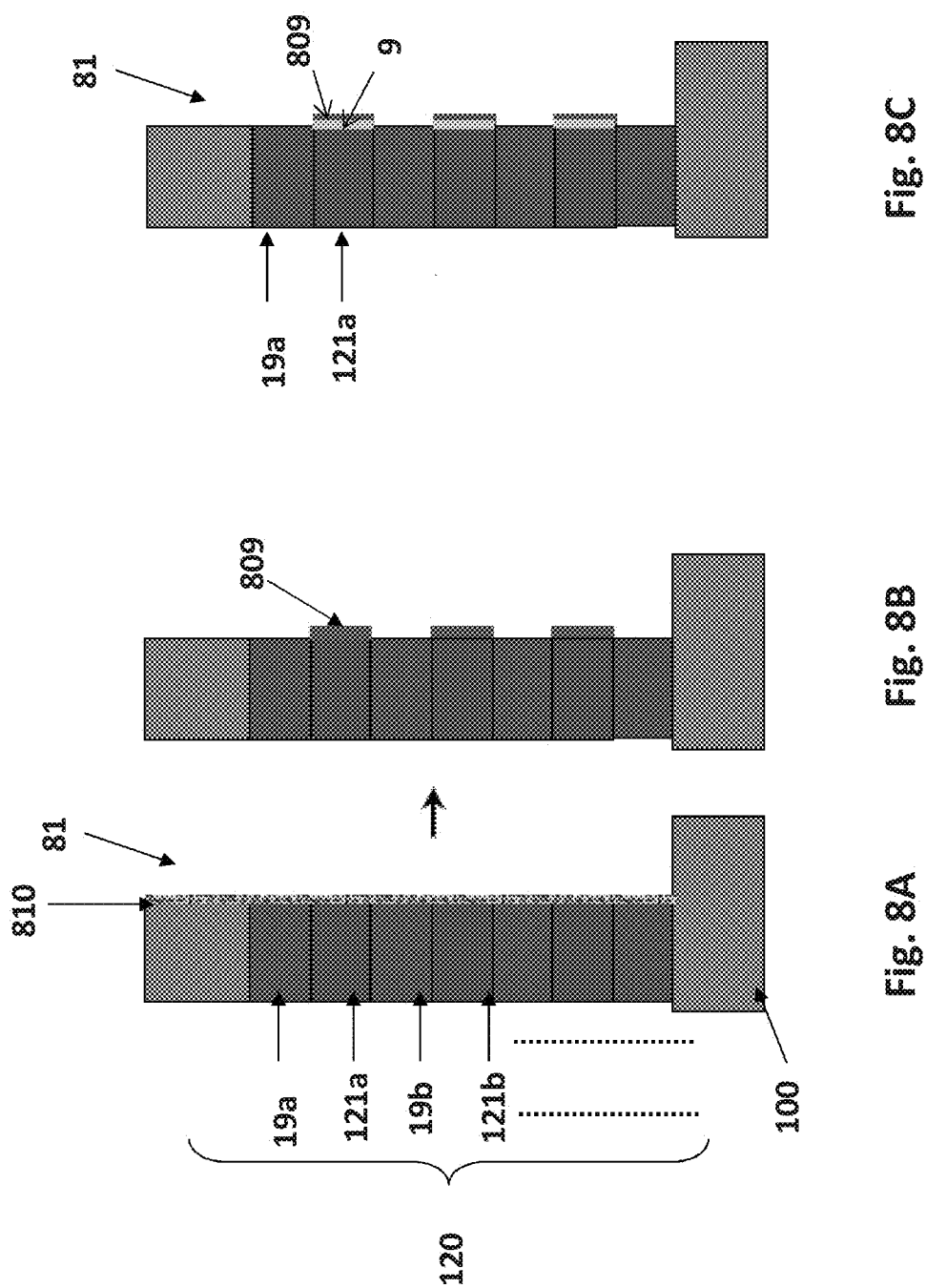

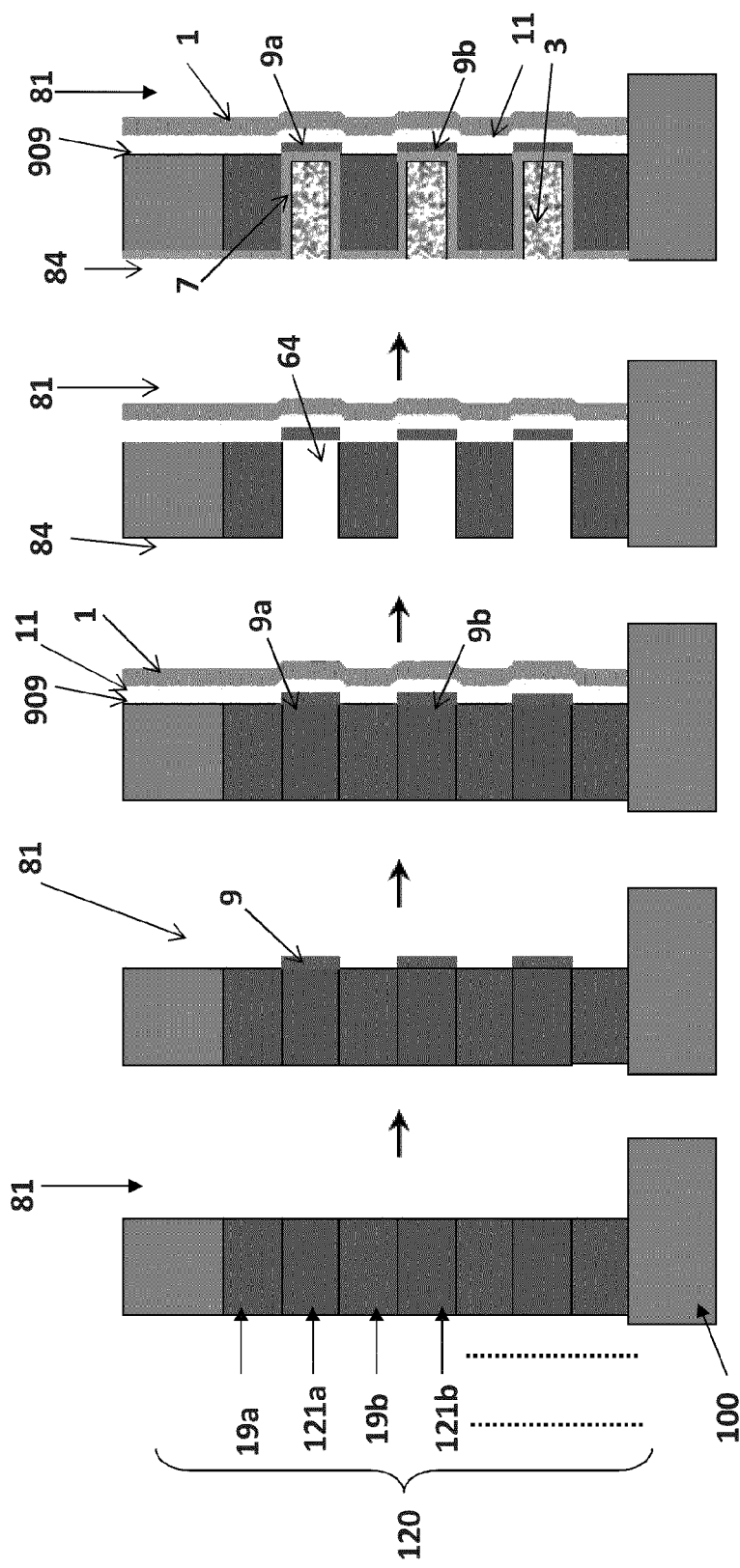

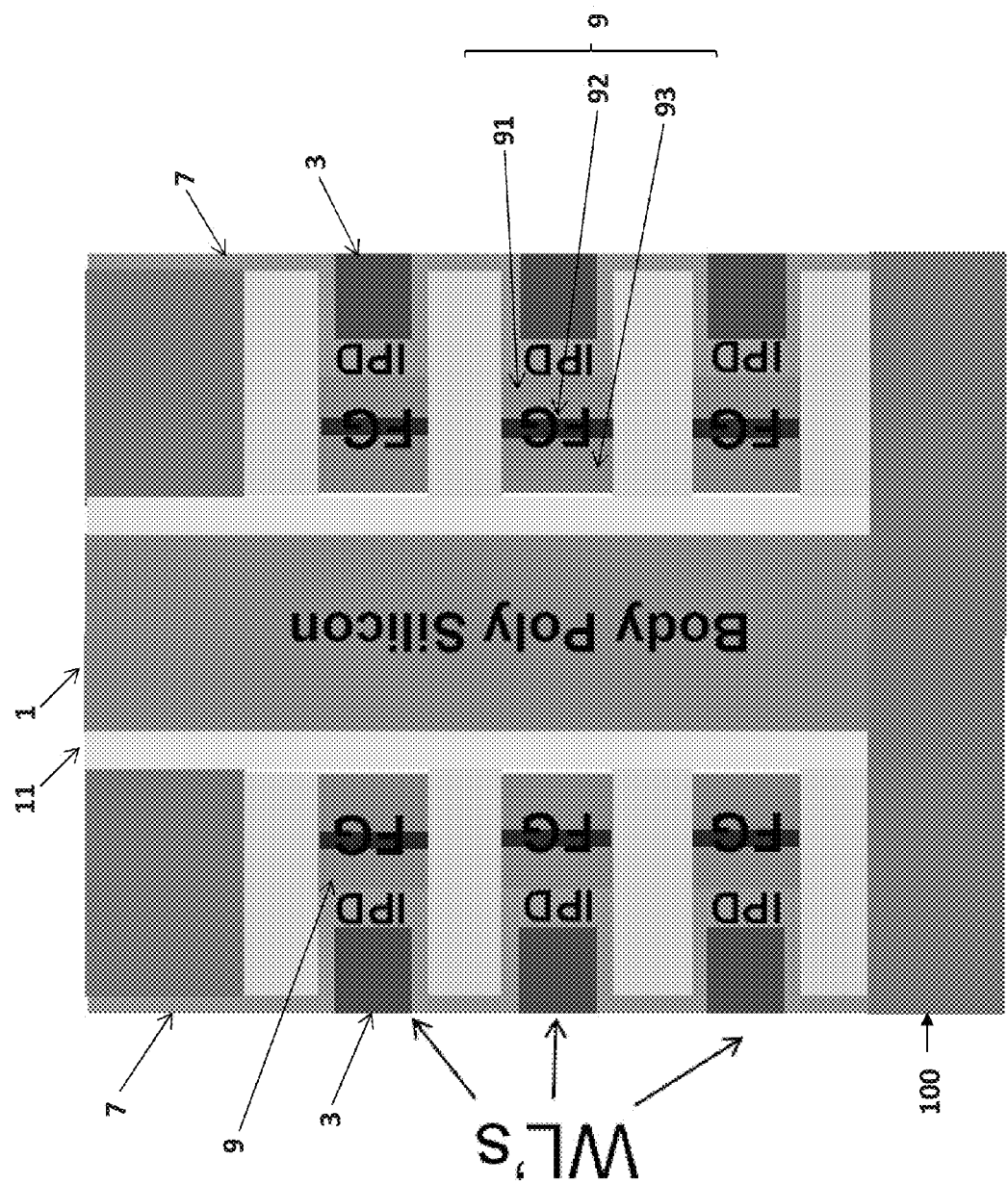

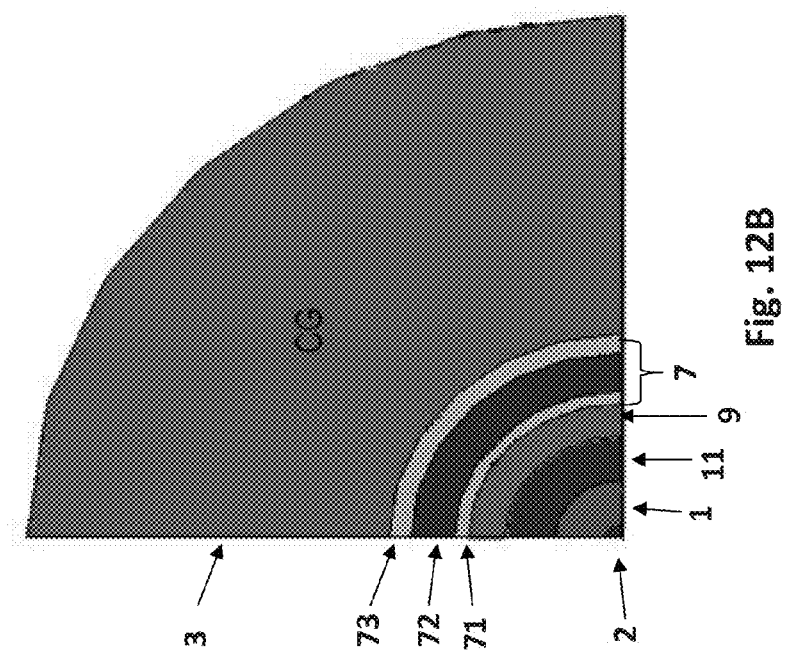
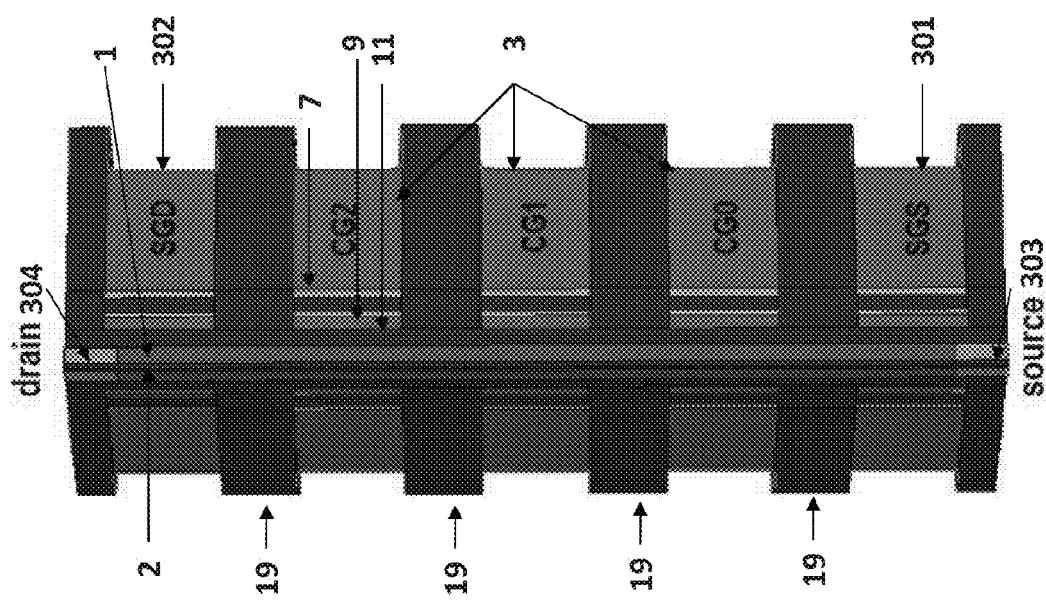
Fig. 12B
Fig. 12A

THREE DIMENSIONAL NAND DEVICE WITH SILICIDE CONTAINING FLOATING GATES AND METHOD OF MAKING THEREOF

CROSS REFERENCE TO RELATED APPLICATIONS

The present application is a divisional of U.S. application Ser. No. 14/190,974, filed Feb. 26, 2014, which is a continuation-in-part of U.S. application Ser. No. 14/051,627, filed Oct. 11, 2013, now U.S. Pat. No. 8,765,543, which is a divisional of U.S. application Ser. No. 13/875,854, filed May 2, 2013, now U.S. Pat. No. 8,580,639, which is a divisional of U.S. application Ser. No. 13/693,337, filed Dec. 4, 2012, now U.S. Pat. No. 8,461,000, which is a divisional of U.S. application Ser. No. 12/827,761 filed on Jun. 30, 2010, now U.S. Pat. No. 8,349,681. U.S. application Ser. No. 14/190,974 is also a continuation-in-part of U.S. application Ser. No. 13/762,988 filed on Feb. 8, 2013, and claims benefit of priority of U.S. Provisional Application Ser. No. 61/862,912 filed on Aug. 6, 2013. All of the priority applications are incorporated herein by reference in their entirety.

FIELD

The present invention relates generally to the field of semiconductor devices and specifically to three dimensional vertical NAND strings and other three dimensional devices and methods of making thereof.

BACKGROUND

Three dimensional vertical NAND strings are disclosed in an article by T. Endoh, et. al., titled "Novel Ultra High Density Memory With A Stacked-Surrounding Gate Transistor (S-SGT) Structured Cell", IEDM Proc. (2001) 33-36. However, this NAND string provides only one bit per cell. Furthermore, the active regions of the NAND string is formed by a relatively difficult and time consuming process involving repeated formation of sidewall spacers and etching of a portion of the substrate, which results in a roughly conical active region shape.

SUMMARY

An embodiment relates to a method of making a monolithic three dimensional NAND string, including providing a stack of alternating first material layers and second material layers different from the first material layer over a substrate, the stack comprising at least one opening containing a charge storage material comprising a silicide layer, a tunnel dielectric on the charge storage material in the at least one opening, and a semiconductor channel on the tunnel dielectric in the at least one opening, selectively removing the second material layers without removing the first material layers from the stack and forming control gates between the first material layers.

Another embodiment relates to a monolithic three dimensional NAND string including a semiconductor channel located over a substrate, at least one end of the semiconductor channel extending substantially perpendicular to a major surface of the substrate, a plurality of control gates extending substantially parallel to the major surface of the substrate, wherein the plurality of control gates comprise at least a first control gate located in a first device level and a second control gate located in a second device level located over the substrate and below the first device level, a charge storage material comprising a silicide layer located in the first device level and in the second device level, a blocking dielectric located between the charge storage material and the plurality of control gates and a tunnel dielectric located between the charge storage material and the semiconductor channel. The tunnel dielectric has a straight sidewall, portions of the blocking dielectric have a clam shape and each of the plurality of control gates is located at least partially in an opening in the clam-shaped portion of the blocking dielectric.

BRIEF DESCRIPTION OF THE DRAWINGS

FIG. 1A is a side cross sectional view of the device along line Y-Y' in FIG. 1B, while FIG. 1B is a side cross sectional view of the device along line X-X' in FIG. 1A.

FIG. 2A is a side cross sectional view of the device along line Y-Y' in FIG. 2B, while FIG. 2B is a side cross sectional view of the device along line X-X' in FIG. 2A.

FIGS. 4A-4E, 5A-5E, 6A-6E, 7A-7E, 8A-8C and 9A-9E are side cross sectional views illustrating embodiments of methods of making the NAND strings illustrated in FIGS. 1-3.

FIG. 10 is a side cross sectional view of a NAND string of another embodiment.

FIGS. 12A-12B are respectively side cut away cross sectional and top cross sectional views of a NAND string of one embodiment.

DETAILED DESCRIPTION

The embodiments of the invention provide a monolithic, three dimensional array of memory devices, such as an array of vertical NAND strings having selectively formed, discreet metal, semiconductor or silicide charge storage regions. The NAND strings are vertically oriented, such that at least one memory cell is located over another memory cell. The array allows vertical scaling of NAND devices to provide a higher density of memory cells per unit area of silicon or other semiconductor material.

A monolithic three dimensional memory array is one in which multiple memory levels are formed above a single substrate, such as a semiconductor wafer, with no intervening substrates. The term "monolithic" means that layers of each level of the array are directly deposited on the layers of each underlying level of the array. In contrast, two dimensional arrays may be formed separately and then packaged together to form a non-monolithic memory device. For example, non-monolithic stacked memories have been constructed by forming memory levels on separate substrates and adhering the memory levels atop each other, as in Leedy, U.S. Pat. No. 5,915,167, titled "Three Dimensional Structure Memory." The substrates may be thinned or removed from the memory levels before bonding, but as the memory levels are initially formed over separate substrates, such memories are not true monolithic three dimensional memory arrays.

Figure 1A:
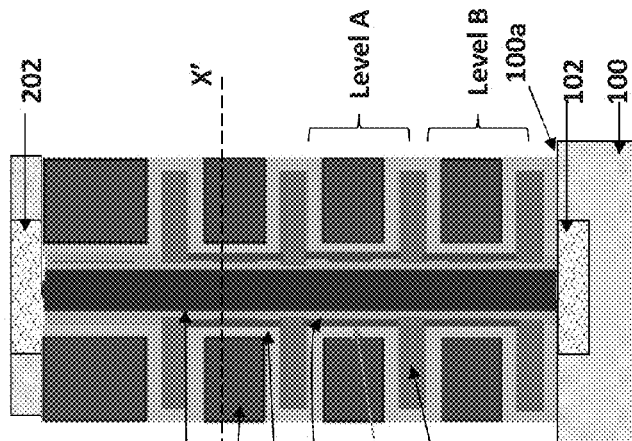
FIGS. 1A-1B are respectively side cross sectional and top cross sectional views of a NAND string of one embodiment.
Figure 2A:
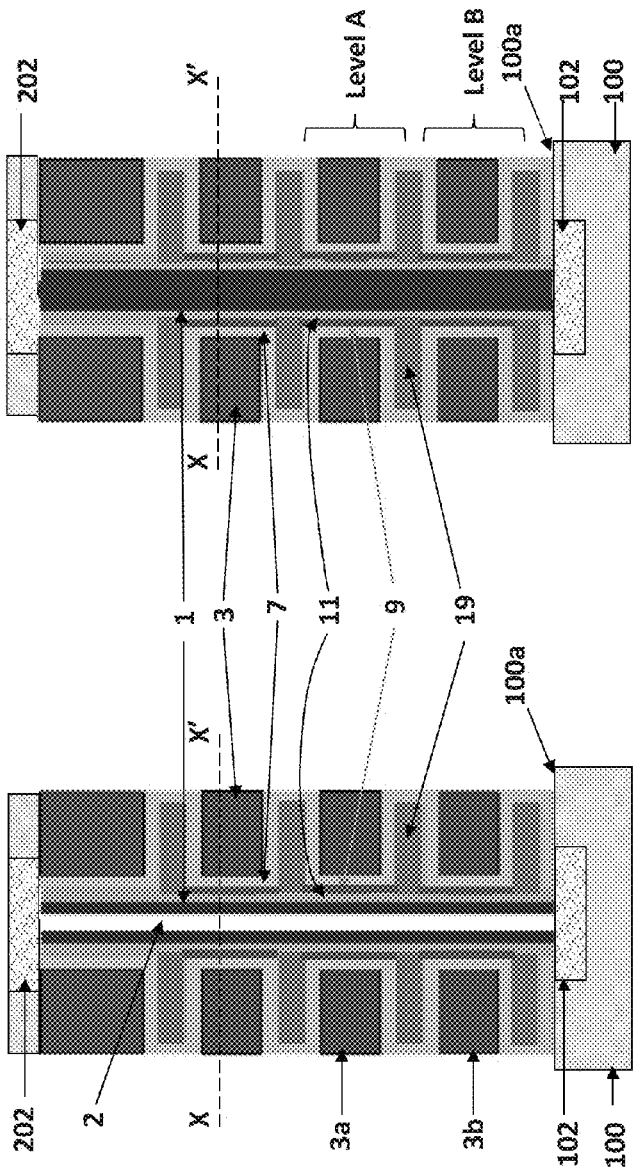
FIGS. 2A-2B are respectively side cross sectional and top cross sectional views of a NAND string of another embodiment.

In some embodiments, the monolithic three dimensional NAND string 180 comprises a semiconductor channel 1 having at least one end portion extending substantially perpendicular to a major surface 100a of a substrate 100, as shown in FIGS. 1A and 2A. For example, the semiconductor channel 1 may have a pillar shape and the entire pillar-shaped semiconductor channel extends substantially perpendicularly to the major surface of the substrate 100, as shown in FIGS. 1A and 2A. In these embodiments, the source/drain electrodes of the device can include a lower electrode 102 provided below the semiconductor channel 1 and an upper electrode 202 formed over the semiconductor channel 1, as shown in FIGS. 1A and 2A. Alternatively, the semiconductor channel 1 may have a U-shaped pipe shape, as shown in FIG. 3. The two wing portions 1a and 1b of the U-shaped pipe shape semiconductor channel may extend substantially perpendicular to the major surface 100a of the substrate 100, and a connecting portion 1c of the U-shaped pipe shape semiconductor channel 1 connects the two wing portions 1a, 1b extends substantially parallel to the major surface 100a of the substrate 100. In these embodiments, one of the source or drain electrodes $202_1$ contacts the first wing portion of the semiconductor channel from above, and another one of a source or drain electrodes $202_2$ contacts the second wing portion of the semiconductor channel 1 from above. An optional body contact electrode (not shown) may be disposed in the substrate 100 to provide body contact to the connecting portion of the semiconductor channel 1 from below. The NAND string's select or access transistors are not shown in FIGS. 1-3 for clarity.

Figure 1B:
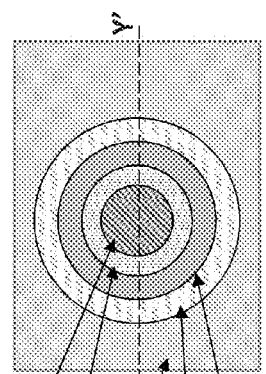
Figure 2B:
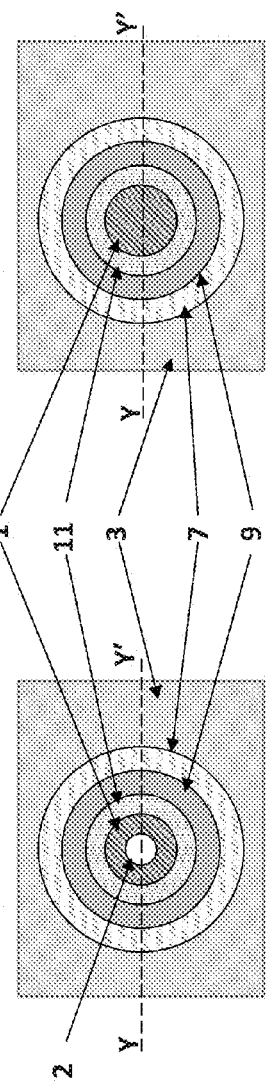
Figure 3:
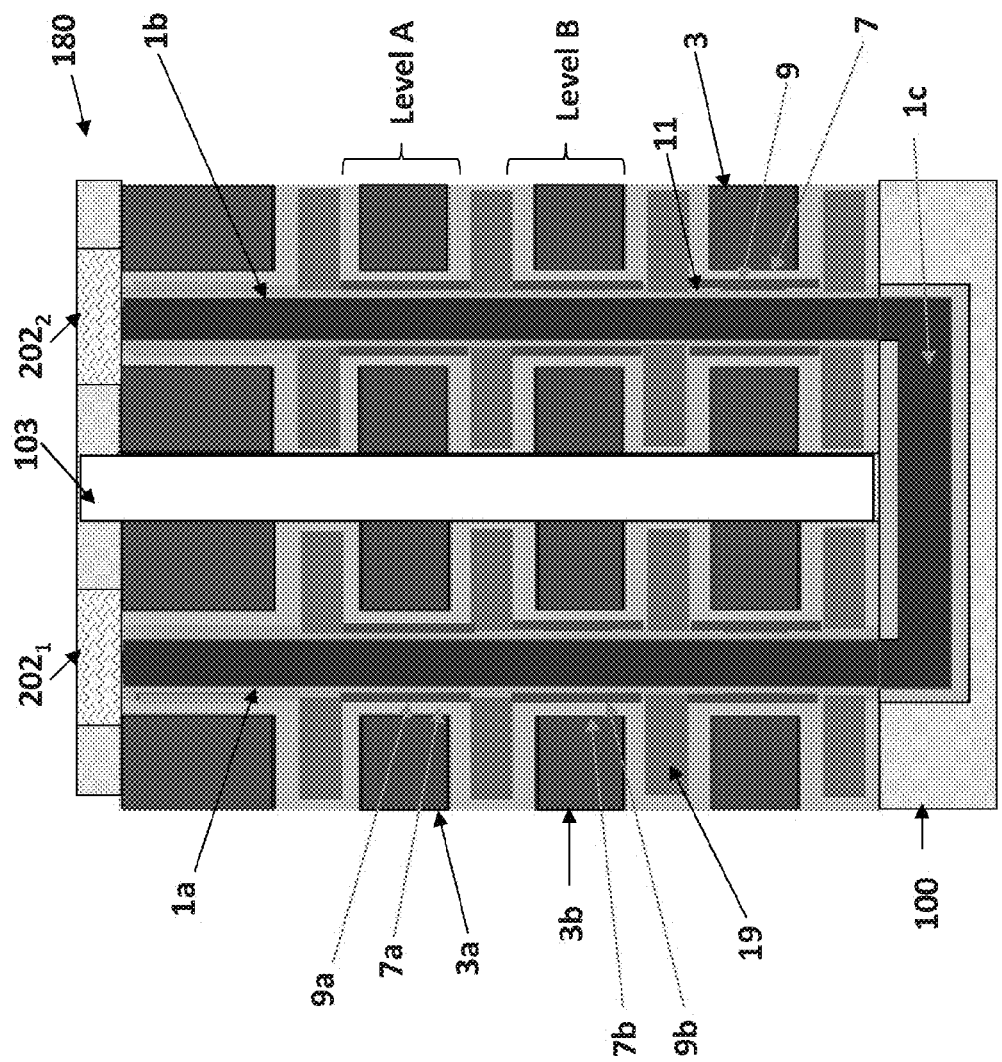
FIG. 3 is side cross sectional view of a NAND string of an embodiment with a U-shaped channel.

In some embodiments, the semiconductor channel 1 may be a filled feature, as shown in FIGS. 2A-2B and 3. In some other embodiments, the semiconductor channel 1 may be hollow, for example a hollow cylinder filled with an insulating fill material 2, as shown in FIGS. 1A-1B. In these embodiments, an insulating fill material 2 may be formed to fill the hollow part surrounded by the semiconductor channel 1. The U-shaped pipe shape semiconductor channel 1 shown in FIG. 3 may alternatively be a hollow cylinder filled with an insulating fill material 2, shown in FIGS. 1A-1B.

The substrate 100 can be any semiconducting substrate known in the art, such as monocrystalline silicon, IV-IV compounds such as silicon-germanium or silicon-germanium-carbon, III-V compounds, II-VI compounds, epitaxial layers over such substrates, or any other semiconducting or non-semiconducting material, such as silicon oxide, glass, plastic, metal or ceramic substrate. The substrate 100 may include integrated circuits fabricated thereon, such as driver circuits for a memory device.

Any suitable semiconductor materials can be used for semiconductor channel 1, for example silicon, germanium, silicon germanium, or other compound semiconductor materials, such as III-V, II-VI, or conductive or semiconductive oxides, etc. The semiconductor material may be amorphous, polycrystalline or single crystal. The semiconductor channel material may be formed by any suitable deposition methods. For example, in one embodiment, the semiconductor channel material is deposited by low pressure chemical vapor deposition (LPCVD). In some other embodiments, the semiconductor channel material may be a recrystallized polycrystalline semiconductor material formed by recrystallizing an initially deposited amorphous semiconductor material.

The insulating fill material 2 may comprise any electrically insulating material, such as silicon oxide, silicon nitride, silicon oxynitride, or other high-k insulating materials.

The monolithic three dimensional NAND string further comprise a plurality of control gate electrodes 3, as shown in FIGS. 1A-1B, 2A-2B, and 3. The control gate electrodes 3 may comprise a portion having a strip shape extending substantially parallel to the major surface 100a of the substrate 100. The plurality of control gate electrodes 3 comprise at least a first control gate electrode 3a located in a first device level (e.g., device level A) and a second control gate electrode 3b located in a second device level (e.g., device level B) located over the major surface 100a of the substrate 100 and below the device level A. The control gate material may comprise any one or more suitable conductive or semiconductor control gate material known in the art, such as doped polysilicon, tungsten, copper, aluminum, tantalum, titanium, cobalt, titanium nitride or alloys thereof.

A blocking dielectric 7 is located adjacent to the control gate(s) 3 and may surround the control gate 3. The blocking dielectric 7 may comprise a layer having plurality of blocking dielectric segments located in contact with a respective one of the plurality of control gate electrodes 3, for example a first dielectric segment 7a located in device level A and a second dielectric segment 7b located in device level B are in contact with control electrodes 3a and 3b, respectively, as shown in FIG. 3.

The monolithic three dimensional NAND string also comprise a plurality of discrete charge storage regions or segments 9 located between the blocking dielectric 7 and the channel 1. Similarly, the plurality of discrete charge storage regions 9 comprise at least a first discrete charge storage region 9a located in the device level A and a second discrete charge storage region 9b located in the device level B, as shown in FIG. 3.

The discrete charge storage regions 9 may comprise a plurality of vertically spaced apart, conductive (e.g., metal such as tungsten, molybdenum, tantalum, titanium, platinum, ruthenium, and alloys thereof, or a metal silicide such as tungsten silicide, molybdenum silicide, tantalum silicide, titanium silicide, nickel silicide, cobalt silicide, or a combination thereof), or semiconductor (e.g., polysilicon) floating gates.

The tunnel dielectric 11 of the monolithic three dimensional NAND string is located between each one of the plurality of the discrete charge storage regions 9 and the semiconductor channel 1.

The blocking dielectric 7 and the tunnel dielectric 11 may be independently selected from any one or more same or different electrically insulating materials, such as silicon oxide, silicon nitride, silicon oxynitride, or other insulating materials. The blocking dielectric 7 and/or the tunnel dielectric 11 may include multiple layers of silicon oxide, silicon nitride and/or silicon oxynitride (e.g., ONO layers).

FIGS. 4A-4E illustrate a method of making a NAND string according to a first embodiment of the invention.

Referring to FIG. 4A, a stack 120 of alternating layers 19 (19a, 19b etc.) and 121 (121a, 121b, etc.) are formed over the major surface of the substrate 100. Layers 19, 121 may be deposited over the substrate by any suitable deposition method, such as sputtering, CVD, PECVD, MBE, etc. The layers 19, 121 may be 6 to 100 nm thick.

In this embodiment, the first layers 19 comprise an electrically insulating material. Any suitable insulating material may be used, such as silicon oxide, silicon nitride, silicon oxynitride, a high-k dielectric (e.g., aluminum oxide, hafnium oxide, etc. or an organic insulating material). The second layers 121 comprise a sacrificial material, such a semiconductor material. For example, layers 121 may comprise silicon, such as amorphous silicon or polysilicon, or another semiconductor material, such as a group IV semiconductor, including silicon-germanium and germanium. Preferably, layers 121 comprise intrinsic or undoped (if the as-deposited material inherently has a low p-type or n-type conductivity) semiconductor material, such as intrinsic or undoped polysilicon or amorphous silicon. However, p-type or n-type doped semiconductor materials, such as lightly or heavily doped materials may also be used if desired. The term heavily doped includes semiconductor materials doped n-type or p-type to a concentration of above $10^{18}$ cm$^{-3}$. In contrast, lightly doped semiconductor materials have a doping concentration below $10^{18}$ cm$^{-3}$ and intrinsic semiconductor materials have a doping concentration below $10^{15}$ cm$^{-3}$.

The deposition of layers 19, 121, is followed by etching the stack 120 to form at least one a front side opening 81 in the stack 120. An array of a front side openings 81 (e.g., memory holes) may be formed in locations where vertical channels of NAND strings will be subsequently formed. The openings 81 may be formed by photolithography and etching.

Next, in an optional step as shown in FIG. 4B, the second material 121 is selectively etched compared to the first material 19 to form front side recesses 62 in the second material 121 (i.e., layers 121a, 121b, etc). The recesses 62 may be formed by selective, isotropic wet or dry etching which selectively etches the second material 121 compared to the first material 19. The depth of each recess 62 may be 3 to 20 nm. As will be described below, this step may be omitted if desired.

As shown in FIG. 4C, a plurality of discrete semiconductor, metal or silicide charge storage regions 9 are selectively formed on portions of the second material layers 121 exposed in the front side opening 81. The charge storage regions 9 comprise a plurality of charge storage segments or regions (e.g., 9a and 9b) located on the exposed edges of the second material 121 in the front side recesses 62.

In one embodiment, the charge storage regions 9 are selectively formed by selective growth of the regions on the exposed edges of the semiconductor second material layers 121 but not on the exposed insulating first material layers 19. Any suitable selective growth methods may be used to form the charge storage regions 9, such as chemical vapor deposition.

In one aspect of the selective growth embodiment, charge storage regions 9 comprise doped polysilicon regions which are selectively grown by CVD on the portions of the undoped or intrinsic second material layers 121 (e.g., undoped or intrinsic semiconductor having a polycrystalline or amorphous structure, such as polysilicon, amorphous silicon, silicon germanium or germanium) exposed in the front side opening 81. For example, the doped polysilicon regions 9 may comprise boron doped, p-type polysilicon regions (e.g., lightly or heavily doped) which are selectively, epitaxially grown on polysilicon layer 121 edges exposed in the front side openings 81. The doped polysilicon regions 9 are not grown on portions of the first material layers 19 (e.g., silicon oxide) exposed in the front side opening 81.

Any suitable silicon selective epitaxial growth (SEG) conditions may be used to form regions 9. For example, a chemical vapor deposition (CVD) SEG process which combines a silicon source gas and a silicon growth inhibitor gas which inhibits silicon growth on the oxide layers 19 may be used. Exemplary silicon source gases include silane and chlorosilanes (e.g., SiH$_4$, SiH$_2$Cl$_2$, and/or SiHCl$_3$). Exemplary inhibitor gases which inhibit silicon growth on SiO$_2$ include HCl and/or Cl$_2$. H$_2$ may be used as a carrier gas while B$_2$H$_6$, AsH$_3$ and/or PH$_3$ gases may be added to introduce dopants to the silicon regions 9. Any suitable SEG temperatures and pressures may be used, such as a temperature of 500 to 800 C and a pressure of 10 mTorr to 100 Torr (i.e., LPCVD). Similar process conditions may be used to form germanium or silicon-germanium charge storage regions 9, where germane (GeH$_4$) is substituted for silane or provided in addition to silane, at lower temperatures (e.g., 340 to 380 C) and pressure of about 10 mTorr–5 Torr, such as about 1 Torr.

If it is desirable to form a metal silicide floating gates 9a, 9b rather than polysilicon floating gates 9a, 9b, then a thin silicide forming metal layer, such as titanium, cobalt or nickel is formed by any suitable method, such as ALD or sputtering, over the polysilicon floating gates 9a, 9b shown in FIG. 4C. After a silicidation anneal, the floating gates 9a, 9b are converted to a metal silicide (e.g., titanium, cobalt, nickel, etc. silicide) by the reaction of the metal and the polysilicon. Unreacted portions of the metal layer which remain over portions of insulating material 19 are then selectively etched.

In another aspect of the selective growth embodiment, charge storage regions 9 comprise selectively grown metal or silicide charge storage regions, such as on the portions of the second material layers exposed in the front side opening. Any metal (i.e., pure metal or conductive metal alloy) or metal silicide which may be selectively grown on exposed semiconductor layer 121 in the opening 81 may be used. For example, the charge storage regions 9 may comprise selectively grown tungsten, molybdenum or tantalum regions that are selectively grown on the semiconductor material (e.g., silicon) 121 but not on insulating material (e.g., silicon oxide) 19 from a metal halide source gas (e.g., tungsten hexafluoride) in a CVD process.

Selective deposition of refractory metals, such as W, Mo or Ta, on silicon may be performed by metal halide source gas reduction by SiH$_4$, where a ratio of SiH$_4$ to metal halide is less than one. For example, as disclosed in U.S. Pat. Nos. 5,084, 417 and 5,807,788, incorporated herein by reference in their entirety, in the selective CVD process, the metal halide source gas may comprise WF$_6$, MoF$_6$ or TaCl$_5$ and the deposition temperature and pressure may range from 370 to 550 C and 100 to 500 mTorr, respectively. The ratio of the SiH$_4$/metal halide flow rates may range between 0.4 and 0.6.

If the front side recesses 62 are present, then the regions 9 may be selectively grown in the front side recesses 62 until their edges are about even with the edges of the insulating material 19 such that they form a relatively straight sidewall of the front side opening 81 (e.g., as much as a timed selective growth permits). Alternatively, the selective growth of regions 9 is terminated before regions 9 completely fill the recesses 62. Thus, regions 9 may partially fill recesses 62 and may remain horizontally recessed in the opening 81 compared to insulating material layers 19. Alternatively, the selective growth of regions 9 is terminated after regions 9 completely fill the recesses 62 such that the regions 9 protrude horizontally into the front side opening 81 past layers 19, as shown in FIG. 5C.

In another embodiment, the regions 9 are selectively formed by doping of the semiconductor layers 121 exposed in the front side opening 81. For example, when layers 121 comprise intrinsic or undoped semiconductor layers, a timed gas phase diffusion doping may be carried out to doped the edge portions 9 of layers 121 facing the opening 81 by providing a doping gas through the opening 81. The doping is terminated before the entire volume of layers 121 are doped, such that portions of layers 121 located behind regions 9 and facing away from the opening 81 remain undoped. For example, for Group IV semiconductor material (e.g., silicon) layers 121, the doping gas may comprise a boron containing gas, such as diborane, to form p-type doped regions 9, or a phosphorus or arsenic containing gas, such as phosphine or arsene, to form n-type doped regions 9.

In the next step shown in FIG. 4C, a tunnel dielectric layer 11 is deposited over the charge storage regions 9a, 9b and the insulating first material layers 19 between the charge storage regions in the front side opening 81. Then, the channel 1 is formed by depositing channel material 1, such as a lightly doped or intrinsic polysilicon over the tunnel dielectric layer 11 in the front side opening 81. If desired, a high temperature anneal may be performed after forming the channel.

As discussed above, the entire opening 81 may be filled to form the device illustrated in FIGS. 2A and 2B. Alternatively, a layer of channel material may first be deposited in the opening 81 followed by deposition of an insulating fill material 2 to form the device illustrated in FIGS. 1A and 1B. If desired, the channel 1 may be U-shaped as illustrated in FIG. 3.

The channel 1 may be formed by filling the front side opening 81 with a lightly doped semiconductor material (e.g., polysilicon) and then etched back from the top to form the pillar shaped (or U-shaped) channel 1 in the opening 81. In the embodiment of FIG. 3, the space between the wings of the U-channel 1 is filled with a gap fill insulating layer 103, such as silicon oxide or another material. Layer 103 may be formed by etching the stack 120 to form a rail shaped cut, followed by depositing an oxide layer followed by etch back or chemical mechanical polishing to form a planar top surface exposing the top surfaces of the channels 1. The channels are then connected to source and drain electrodes 102, 202 as shown in FIGS. 1-3, the select gate electrodes (not shown for clarity) are connected to select gate contacts and the control gate electrodes 3 are connected to word line contacts as known in the art.

In the next step shown in FIG. 4D, the stack 120 is patterned to form one or more back side openings 84 in the stack. The back side opening(s) 84 may be formed by photolithography and anisotropic etching of the stack. Preferably, the opening(s) 84 have a slit shape.

Then, at least a portion of the second material layers 121 are removed through the back side opening 84 to form back side recesses 64 between the first material layers 19. For example, layers 121 may be removed completely by selective wet etching using a liquid etching medium which selectively etches the material of layers 121 compared to the materials of layers 19 and regions 9. For example, if layers 121 comprise undoped or intrinsic polysilicon, layers 19 comprise silicon oxide and regions 9 comprise doped polysilicon, silicide or metal, then an undoped polysilicon selective etch may be used which stops on doped polysilicon (e.g., p-type polysilicon) regions 9 which act as an etch stop. Alternatively, the selective etch may be a timed etch which is timed to remove only a portion of the sacrificial second material layers 121 through the back side opening 84. In this case, a remaining portion of the second material layers 121 rather than regions 9 remain exposed in the back side recesses 64.

Then, as shown in FIG. 4E, the blocking dielectric layer 7 (also known as an inter-poly dielectric, IPD) is then formed in the back side recesses 64 through the back side opening 84 such that the blocking dielectric coats the sides of the back side recesses 64 and the back side of layers 19 exposed in the back side opening 84. The blocking dielectric layer 7 may comprise a silicon oxide layer deposited by conformal atomic layer deposition (ALD) or chemical vapor deposition (CVD). Other high-k dielectric materials, such as hafnium oxide, or multi-layer dielectrics (e.g., ONO) may be used instead or in addition to silicon oxide. Optionally, an insulating capping layer (e.g., silicon nitride) may be deposited into the openings before the blocking dielectric 7 and may comprise a back portion of a multi-layer blocking dielectric. The blocking dielectric 7 may have a thickness of 6 to 20 nm. An optional anneal, such as a rapid thermal anneal, may be conducted after the blocking dielectric formation.

The blocking dielectric layer 7 comprises a plurality of clam-shaped blocking dielectric segments 7a, 7b in the back side recesses 64 connected to each other by vertical portions 7c of the blocking dielectric layer 7 located on the exposed edges of the first material layers 19 in the back side opening 84. As used herein a "clam" shape is a side cross sectional shape configured similar to an English letter "C". A clam shape has two segments which extend substantially parallel to each other and to the major surface 100a of the substrate 100. The two segments are connected to each other by a third segment which extends substantially perpendicular to the first two segments and the surface 100a. Each of the three segments may have a straight shape (e.g., a rectangle side cross sectional shape) or a somewhat curved shape (e.g., rising and falling with the curvature of the underlying topography). The term substantially parallel includes exactly parallel segments as well as segments which deviate by 20 degrees or less from the exact parallel configuration. The term substantially perpendicular includes exactly perpendicular segments as well as segments which deviate by 20 degrees or less from the exact perpendicular configuration. The clam shape preferably contains an opening bounded by the three segments and having a fourth side open.

The opening in the clam shaped blocking dielectric segments is then filled by a control gate 3 material. As described above, the control gate material may comprise a metal, such as tungsten or a heavily doped semiconductor, such as polysilicon. The control gate material may be deposited by CVD and fills the remaining volume of the back side recesses 64 inside the clam shaped blocking dielectric 7 segments and the entire back side opening 84. The deposition of the control gate material is followed by etching the control gate material to remove it from the back side opening 84 using anisotropic etching, while leaving the control gate material inside the back side recesses 64 in the clam shaped blocking dielectric 7 segments. The remaining control gate material inside the back side recesses 64 forms the control gates 3 of the vertical NAND string.

FIGS. 5A-5E illustrate a method of making a vertical NAND string according to another embodiment. The steps resulting in the structure shown in FIG. 5A are the same as described above with respect to FIG. 4A. However, in this embodiment, the front side recesses 62 shown in FIG. 4B are omitted. In this embodiment, the charge storage regions 9 are selectively grown on exposed edges of the sacrificial layers 121 exposed in the front side opening 81. Thus, as shown in FIG. 5B, the charge storage regions 9 protrude horizontally (i.e., parallel to the major surface 100a of the substrate 100) into the front side opening 81.

The process then proceeds in the same manner as described above with respect to FIGS. 4C-4E. Thus, the tunnel dielectric layer 11 and the channel 1 are formed in the front side opening 81, as shown in FIG. 5C. The sacrificial layers 121 are at least partially removed through the back side opening 84, as shown in FIG. 5D. Finally, the blocking dielectric 7 and the control gates 3 are formed through the back side opening as shown in FIG. 5E.

Thus, as shown in FIGS. 5D-5E, the plurality of vertically spaced apart charge storage regions 9 protrude into the tunnel dielectric 11 such that the tunnel dielectric 11 and the semiconductor channel 1 curve around the plurality of vertically spaced apart charge storage regions 9. Thus, the tunnel dielectric 11 of this embodiment has a curved rather than a straight sidewall.

FIGS. 6A-6E illustrate a method of making a vertical NAND string according to another embodiment using a back side silicide charge storage region 9 formation. The steps resulting in the structure shown in FIG. 6A are the same as described above with respect to FIGS. 4A-4C or 5A-5C. Thus, the initial process steps may be the same as the steps shown in FIGS. 4A-4C or 5A-5C and described above, to form either recessed or protruding semiconductor charge storage regions 9, tunnel dielectric 11 and channel 1 in the front side opening 81. In other words, FIG. 6A illustrates an in-process device at the same stage as either FIG. 4C or 5C.

Then, as shown in FIG. 6B, the back side opening 84 and the back side recesses 64 are formed, using steps similar to those described above with respect to FIG. 4D or 5D. The entire sacrificial material layers 121 are removed to expose the silicon (e.g., doped polysilicon) charge storage regions 9 in the back side recesses 64, as shown in FIG. 6B.

Then, after the second material layers 121 are removed to expose the polysilicon charge storage regions 9 in the back side recesses 64, a metal layer 610 is formed through the back side opening 84 in the back side recesses 64, such that portions 610a of the metal layer 610 are in contact with the polysilicon charge storage regions 9, as shown in FIG. 6C. The metal layer 610 may be formed using CVD or other deposition methods. The metal layer 610 may comprise any metal layer which may form a silicide when it reacts with silicon. For example, the metal layer may comprise tungsten, molybdenum, tantalum, titanium, nickel, cobalt, etc.

Following the metal layer 610 deposition step, the structure is annealed using any suitable silicidation anneal parameters to react portions 610a of the metal layer 610 with the silicon charge storage regions 9 to convert the silicon (e.g., polysilicon) charge storage regions to silicide charge storage regions 609 (e.g., 609a, 609b, etc.). The silicide charge storage regions may comprise tungsten silicide, molybdenum silicide, tantalum silicide, titanium silicide, nickel silicide, cobalt silicide, etc.

Preferably, the entire silicon charge storage regions 9 are converted to silicide charge storage regions 609 so that no unreacted silicon remains in the charge storage regions. Alternatively, only part of the silicon charge storage regions are converted to silicide charge storage regions 609, such that the charge storage regions comprise inner silicide portions adjacent to the blocking dielectric 7 and outer silicon portions adjacent to the tunnel dielectric 11. Then, as shown in FIG. 6D, the remaining unreacted portions 610b of the metal layer 610 are removed by any suitable selective wet etching without removing the silicide charge storage regions 609, as is typical in a silicide formation process.

The process then proceeds in the same manner as described above with respect to FIG. 4E or 5E, where the blocking dielectric 7 and the control gates 3 are formed through the back side opening 84 as shown in FIG. 6E.

FIGS. 7A-7E illustrate a method of making a vertical NAND string according to an alternative embodiment using a back side silicide formation. In this embodiment, portions 721 of the sacrificial semiconductor layers 121, such as polysilicon or amorphous silicon layer portions 721, remain in the back side recesses 64. The charge storage regions 9 may comprise semiconductor, metal or silicide regions in this embodiment.

The steps resulting in the structure shown in FIG. 7A are the same as described above with respect to FIGS. 4A-4C or 5A-5C or 6A. Then, as shown in FIG. 6B, the back side opening 84 and the back side recesses 64 are formed, using steps similar to those described above with respect to FIG. 4D or 5D. Only parts of the entire sacrificial semiconductor material layers 121 are removed to leave portions 721 of the sacrificial semiconductor layers 121 exposed in the back side recesses 64, as shown in FIG. 7B.

Then, as shown in FIG. 7C, a metal layer 610 is formed through the back side opening 84 in the back side recesses 64, such that portions 610a of the metal layer 610 are in contact with the remaining portions 721 of the sacrificial semiconductor layers.

Following the metal layer 610 deposition step, the structure is annealed using any suitable silicidation anneal parameters to react portions 610a of the metal layer 610 with the portions 721 of the sacrificial semiconductor layers to convert the portions 721 of the sacrificial semiconductor layers to silicide storage regions 609 (e.g., 609a, 609b).

If the charge storage regions 9 comprise silicon (e.g., polysilicon), then the silicon charge storage regions 9 may also converted to silicide charge storage regions 609 together with portions 721 so that no unreacted silicon remains in the charge storage regions, similar to the structure shown in FIG. 6D.

Alternatively, as shown in FIG. 7D, only the portions 721 of the sacrificial semiconductor layers are converted to silicide charge storage regions 609, leaving initial charge storage regions 9 unconverted. This forms composite charge storage regions which comprise inner silicide portions 609 adjacent to the blocking dielectric 7 and outer silicon, silicide or metal portions 9 adjacent to the tunnel dielectric 11, as shown in FIG. 7D. Then, the remaining unreacted portions 610b of the metal layer 610 are removed by any suitable selective wet etching without removing the silicide charge storage regions 609, as is typical in a silicide formation process. The process then proceeds in the same manner as described above with respect to FIG. 4E or 5E, where the blocking dielectric 7 and the control gates 3 are formed through the back side opening 84 as shown in FIG. 7E.

FIGS. 8A-8B illustrate a method of making a vertical NAND string according to an alternative embodiment using a front side silicide formation. The steps resulting in the structure shown in FIG. 8A are the same as described above with respect to FIGS. 4A-4C or 5A-5C or 6A, except for the deposition of the metal layer 810.

Thus, as shown in FIG. 8A, the stack 120 is formed and then patterned to form the front side opening 81. The charge storage regions 9 may be omitted if the sacrificial layers 121 comprise silicon (e.g., doped or undoped polysilicon or amorphous silicon), as shown in FIG. 8A. Alternatively, silicon (e.g., doped polysilicon) charge storage regions 9 may be selectively formed on the sacrificial layers 121 in the front side recesses 62, as shown in FIG. 4C, or protruding into the front side opening 81, as shown in FIG. 5C.

Then, a silicide forming metal layer 810 is formed in the front side opening 81. Layer 810 may comprise the same material as that described for layer 610 above. The metal layer 810 contacts the edges of the silicon sacrificial layers 121 if the charge storage regions 9 are not present or the metal layer 810 contacts the charge storage regions 9 if these regions are present in the front side opening 81.

The structure is then subjected to a silicidation anneal to react the metal layer 810 with the silicon regions exposed in the front side opening 81, as shown in FIG. 8B. For example, if the charge storage regions 9 are omitted as shown in FIG. 8A, then the metal layer 810 is reacted with the edge portions of the second (sacrificial silicon) material layers 121 exposed in the front side opening 81 to selectively form discrete silicide charge storage regions 809.

If the silicon charge storage regions 9 are present, then the metal layer 810 is reacted with the silicon charge storage regions 9 exposed in the front side opening 81 to convert all or parts of the silicon charge storage regions 9 to discrete silicide charge storage regions 809. If only the front parts of the silicon charge storage regions 9 are converted to silicide regions 809, then composite charge storage regions are formed. The composite charge storage regions comprise outer silicide portions 809 adjacent to the tunnel dielectric 11 and inner silicon portions 9 adjacent to the blocking dielectric 7, as shown in FIG. 8C.

Then, the remaining unreacted portions of the metal layer 810 are removed by any suitable selective wet etching without removing the discrete silicide charge storage regions 809, as is typical in a silicide formation process. The process then proceeds in the same manner as described above with respect to FIGS. 4D-4E or 5D-5E, where the sacrificial layers 121 are removed through the back side opening 84 and then the blocking dielectric 7 and the control gates 3 are formed through the back side opening 84.

In another embodiment, the plurality of discrete semiconductor, metal or silicide charge storage regions 9, 609, 809 are nitrided to form nitrided charge storage regions. For example, any of the charge storage regions described above and shown in FIG. 4, 5, 6, 7 or 8 may be annealed in a nitrogen containing ambient, such nitrogen or NO radical ambient at an elevated temperature, to convert at least a portion of the charge storage region to a nitride material.

For example, the edge or outer portion of the charge storage regions exposed in the front side opening 81 may be converted to a nitride material prior to forming the tunnel dielectric layer 11, while the inner portion of the charge storage regions facing the blocking dielectric 7 may remain a semiconductor, metal or silicide material that is not nitrided. This results in a composite charge storage region. Alternatively, the entire volume of the charge storage material may be nitrided to convert the entire charge storage material to a nitride material.

For example, when the charge storage regions 9 comprise silicon (e.g., polysilicon), the nitridation forms a silicon nitride charge storage region. When the charge storage regions 9 comprise a metal (e.g., tungsten, tantalum, titanium, etc.), the nitridation forms a metal nitride (e.g., tungsten nitride, tantalum nitride, titanium nitride, etc.) charge storage region. Thus, the plurality of vertically spaced apart charge storage regions 9 in this embodiment comprise a nitrided metal.

FIGS. 9A-9E illustrate a method of making a vertical NAND string with a hybrid charge storage structure according to an alternative embodiment. In this embodiment, a silicon nitride charge storage layer 909 is provided in the front side opening 81 in contact with the plurality of discrete semiconductor, metal or silicide charge storage regions 9, 609, 809 described above to form a hybrid charge storage structure. Any of the charge storage regions described above and shown in FIG. 4, 5, 6, 7 or 8 may be combined with the silicon nitride charge storage layer 909 to form the hybrid charge storage structure.

For example, as shown in FIGS. 9A and 9B, the structure described above with respect to FIGS. 5A and 5B having the metal or semiconductor charge storage regions 9 protruding into the front side opening 81 is formed. Then, the silicon nitride layer 909 is formed in the front side opening 81 in contact with the charge storage regions 9, as shown in FIG. 9C. While silicon nitride is a preferred material for layer 909, other continuous dielectric (i.e., electrically insulating) materials, such as silicon oxynitride, may be used instead or in addition to silicon nitride. Thus, a continuous dielectric charge storage layer 909 is located in contact with the plurality of vertically spaced apart charge storage regions 9.

The process then proceeds in the same manner as described above with respect to FIGS. 4D-4E or 5D-5E where the sacrificial layers 121 are removed through the back side opening 84 and then the blocking dielectric 7 and the control gates 3 are formed through the back side opening 84. If desired, at least a part of the charge storage regions may be converted to a silicide using the back side silicidation process described above with respect to FIGS. 6D-6E or 7D-7E. Alternatively, at least a part of the metal or semiconductor charge storage regions may be converted to a silicide or a nitride using the front side silicidation process (as shown in FIGS. 8A-8C) or front side nitridation process described above.

FIG. 10 is a side cross sectional view of a NAND string of another embodiment. In this embodiment, each charge storage region 9 is floating gate made of three layers or regions 91, 92, 93. In an embodiment, the first layer 91 is polysilicon. The first layer 91 may be doped or undoped (i.e., intrinsic). The second layer 92 is preferably a silicide, such as tungsten silicide, molybdenum silicide, tantalum silicide, cobalt silicide, titanium silicide, nickel silicide or any other suitable silicide. In an embodiment, the third layer 93 is polysilicon. The third layer 93 may be doped or undoped, similar to the first layer 91. Further, the first and third layers 91 and 93 need not be the same. For example, the first layer 91 may be a doped polysilicon layer while the third layer 93 may be an undoped polysilicon layer. Alternatively, the first layer 91 may be an undoped polysilicon layer while the third layer 93 may be a doped polysilicon layer.

One embodiment method of making the NAND string will now be described with respect to FIGS. 4A, 4E and 11A-11D. As in previous embodiments, a stack 120 of alternating layers 19 and 121 may be deposited over the substrate 100 by any suitable method, such as sputtering, CVD, PECVD, MBE, etc as illustrated in FIG. 4A. The deposition of layers 19, 121, is followed by etching the stack 120 to form at least one a front side opening 81 in the stack 120. As illustrated in FIG. 4B, the second material 121 is selectively etched compared to the first material 19 to form front side recesses 62 in the second material 121. The recesses 62 may be formed by selective, isotropic wet or dry etching which selectively etches the second material 121 compared to the first material 19. In an embodiment, the second material 121 is polysilicon. The remaining portion of the second material 121 forms the first layer 91 of three layer 91, 92, 93 charge storage region 9 illustrated in FIG. 10.

Figure 11D:
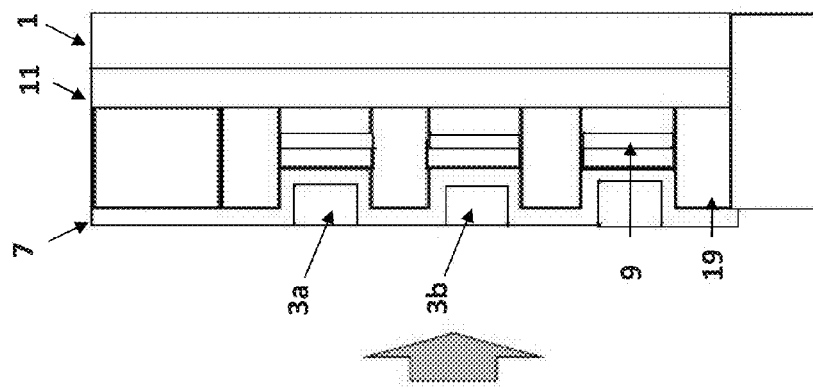
FIGS. 11A-11D are side cross sectional views illustrating an embodiments of methods of making the NAND strings illustrated in FIG. 10.
Figure 11C:
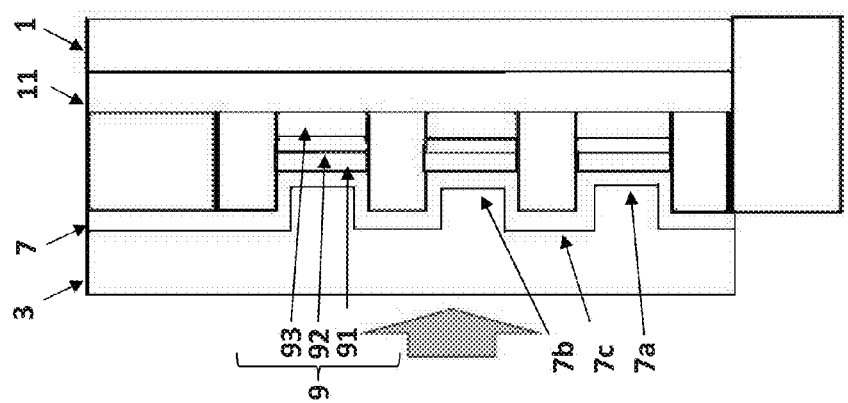
Figure 11B:
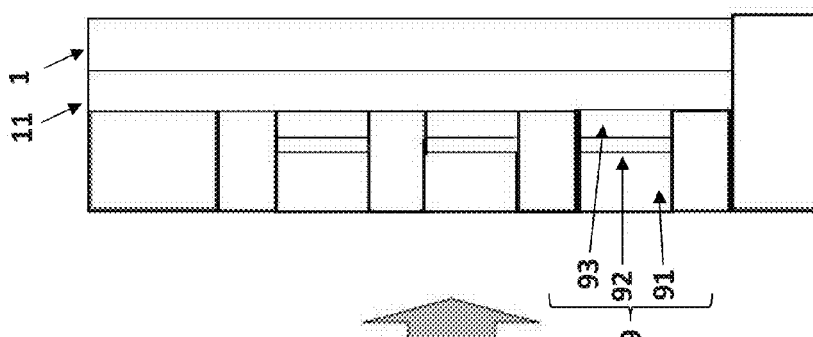
Figure 11A:
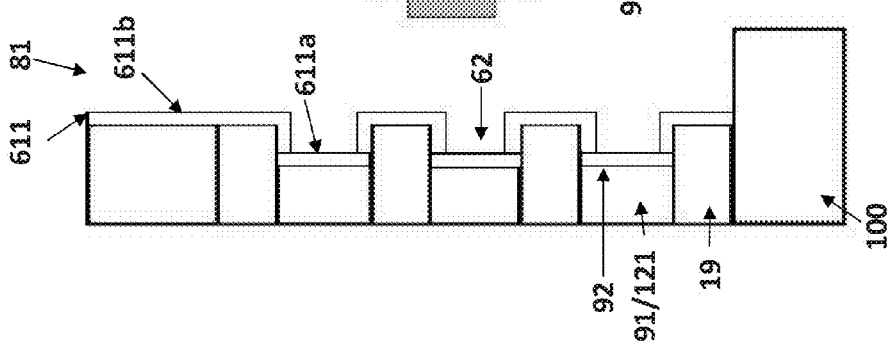

After the front side recesses 62 are formed in the second material 121, a metal layer 611 is formed through the front side opening 81 such that portions 611a of the metal layer 611 are in contact with the edge portions of the polysilicon charge storage region layers 91/121 exposed in the front side recesses 62, as shown in FIG. 11A. The remaining portions 611b of layer 611 contact the exposed edges of layers 19 in opening 81. The metal layer 611 may be formed using CVD or other deposition methods. The metal layer 611 may comprise any metal layer which may form a silicide when it reacts with silicon. For example, the metal layer may comprise tungsten, molybdenum, tantalum, titanium, nickel, cobalt, etc.

Following the metal layer 611 deposition step, the structure is annealed using any suitable silicidation anneal parameters to react portions 611a of the metal layer 611 with the silicon charge storage regions 91 to convert a portion of the silicon (e.g., polysilicon) charge storage regions 91 to silicide charge storage regions 92. The silicide charge storage regions 92 may comprise tungsten silicide, molybdenum silicide, tantalum silicide, titanium silicide, nickel silicide, cobalt silicide, etc.

Next, the remaining unreacted portions 611b of the metal layer 611 located adjacent to the layers of first material 19 are removed by any suitable selective wet etching method without removing the silicide charge storage regions 92, as is typical in a silicide formation process.

As shown in FIG. 11B, the rest of the recess 62 is filled with the third layer 93 of material making up the charge storage regions 9 of the present embodiment. Layer 93 comprises a polysilicon layer which may be deposited conformally on the silicide regions 92 through the opening 81 and followed by an anisotropic etch to remove portions of layer 93 exposed in the opening 81. Portions of layer 93 formed in the recesses 62 remain after the anisotropic etch. Thus, the silicide layer 92 forms discrete charge storage segment portions of the floating gates 9 which fill back portions of the front side recesses 62 and the polysilicon layer 93 fills front portions of the front side recesses 62.

The front side opening 81 is then filled by forming the tunnel dielectric 11 and the channel 1 as described above. The tunnel dielectric 11 has a straight sidewall facing the polysilicon layer 93 portions of the floating gates 9 because the edges of layers 93 and edge of layers 19 exposed in the front side opening 81 are substantially planar with each other (i.e., the edges of layers 93 and 19 form a substantially planar surface of the cylindrical opening 81). Thus, since the recesses 62 are completely filled by layers 93 and layers 93 do not protrude into the opening beyond layers 19, the tunnel dielectric 11 is formed on the substantially planar surface which results in the straight sidewall of the tunnel dielectric. Thus, each of the plurality of discrete, vertically separated floating gates 9 is located in a recess 62 between the insulating layers 19, and the straight sidewall of the tunnel dielectric 11 layer contacts the discrete portion of the polysilicon layer 93 in each floating gate 9.

Next, similar to the step shown in FIG. 4D, the stack 120 is patterned to form one or more back side openings 84 in the stack. The back side opening(s) 84 may be formed by photolithography and anisotropic etching of the stack. Preferably, the opening(s) 84 have a cut shape (e.g., a slit shape, such as a slit shaped trench). Then, a portion of the second material layers 91/121 are removed through the back side opening 84 to form back side recesses 64 between the first material layers 19. For example, portions of layers 91/121 may be removed by a timed selective wet etching using a liquid etching medium which selectively etches the material of layers 91/121 compared to the materials of layers 19. Thus, portions of the polysilicon layers 91/121 located in opening 81 outside (e.g., behind) the front side recesses 62 are removed such that the polysilicon layer 93, the silicide layer 92 and remaining portions of the polysilicon 91/121 layer remaining in the front side recesses 62 form discrete, vertically separated polysilicon-silicide-polysilicon floating gates 9. Each of the plurality of discrete, vertically separated floating gates 9 includes a discrete portion of the polysilicon layer 91, a discrete portion of the polysilicon layer 93 and a discrete portion of the silicide layer 92 located between the discrete portions of the polysilicon layers 91, 93.

Then, as shown in FIG. 11C, the blocking dielectric layer 7 (also known as an inter-poly dielectric, IPD) is then formed in the back side recesses 64 through the back side opening 84 such that the blocking dielectric coats the sides of the back side recesses 64 and the back side of layers 19 exposed in the back side opening 84. Thus, the blocking dielectric 7 coats the back side of the first layer 91 of the charge storage region (e.g., floating gate) 9. The blocking dielectric layer 7 may comprise a silicon oxide layer deposited by conformal atomic layer deposition (ALD) or chemical vapor deposition (CVD). Other high-k dielectric materials, such as hafnium oxide, or multi-layer dielectrics (e.g., ONO) may be used instead or in addition to silicon oxide. Optionally, an insulating capping layer (e.g., silicon nitride) may be deposited into the back side openings 84 before the blocking dielectric 7 and may comprise a back portion of a multi-layer blocking dielectric. The blocking dielectric 7 may have a thickness of 6 to 20 nm. An optional anneal, such as a rapid thermal anneal, may be conducted after the blocking dielectric formation.

Similarly to the embodiment illustrated in FIG. 4E above, the blocking dielectric layer 7 comprises a plurality of clam-shaped blocking dielectric segments 7a, 7b in the back side recesses 64 connected to each other by vertical portions 7c of the blocking dielectric layer 7 located on the exposed edges of the first material layers 19 in the back side opening 84. The blocking dielectric 7 is formed through the back side opening 84 (e.g., the cut area) such that the blocking dielectric 7 contacts the sidewall of the charge storage material (e.g., layer 91 of the floating gate 9) exposed between the first material layers 19.

The opening in the clam shaped blocking dielectric segments 7a, 7b, is then filled by a control gate 3 material. As described above, the control gate 3 material may comprise a metal, such as tungsten, TiN and tungsten, or a heavily doped semiconductor, such as polysilicon. The control gate material may be deposited by CVD and fills the remaining volume of the back side recesses 64 inside the clam shaped blocking dielectric 7 segments and the entire back side opening 84. The deposition of the control gate material is followed by etching the control gate material to remove it from the back side opening 84 using anisotropic etching, while leaving the control gate material inside the back side recesses 64 in the clam shaped blocking dielectric 7 segments. The remaining control gate material inside the back side recesses 64 forms the control gates 3 of the vertical NAND string.

FIGS. 12A and 12B are respectively side cut away cross sectional and top cross sectional views of a NAND string of one embodiment. In the NAND string illustrated in FIG. 12A, the stack includes three device level as indicated by the three control gates CG0, CG1, CG2. However, the three dimensional NAND string of the present embodiment is not limited to three device levels. For example, the three dimensional NAND string may have 2-64 device levels, such as 2-32 device levels, such as 8-16 device levels. The NAND string also includes a source side select transistor and a drain side select transistor, containing the source side select gate SGS 301 and the drain gate select gate SGD 302. The channel region 1 contains doped source 303 and drain 304 regions at its opposite ends. The source and drain regions contact the respective electrodes shown in FIGS. 1A and 2A.

As illustrated in FIG. 12B, an embodiment of a NAND string may include a three layer blocking dielectric 7. The three layer blocking dielectric 7 may include a first layer 71 comprising a nitride (e.g., silicon nitride), a second layer 72 comprising an oxide (e.g., silicon oxide), and a third layer 73 comprising another nitride (e.g., silicon nitride). In an embodiment, the NAND string includes insulating fill material 2 as illustrated in FIG. 12B and discussed in regards to FIGS. 1A and 1B above. Any suitable radial layer thicknesses may be used, such as 3-20 nm, for example about 7 nm, for the channel 1 and tunnel dielectric 11, 1-5 nm, such as about 2 nm for the fill material 2, 3-15 nm, such as about 5 nm for the floating gate 9, and 10-20 nm, such as about 11 nm for the blocking dielectric 7 (e.g., about 2 nm/6 nm/3 nm for the respective nitride/oxide/nitride layers). Layers 19 may be 15-40 nm thick, such as about 25 nm thick in the vertical direction and the control gate layers 3 may be 20-50 nm thick, such as about 35 nm thick in the vertical direction. These exemplary dimensions provide a high width to length ratio of the device.

The three dimensional NAND string with a floating gate 9 made of three layers 91, 92, 93 has an excellent coupling ratio with a faster programming speed than a similar structure using a nitride trap charge storage layer. The NAND string also has the advantage of low cell to cell interference and low capacitive coupling between the adjacent cells. Additionally, the NAND string also has the advantage of low program noise and large program saturation due to its relatively large charge storage region and excellent blocking dielectric. The three dimensional NAND string of the present embodiment also has the advantage of a small channel relative to a two dimensional NAND string while also having the advantage of using Fowler-Nordheim tunneling versus hot hole injection used in nitride trap devices. This is advantageous because hot hole injection tends to cause more damage to the tunneling dielectric during programming than Fowler-Nordheim tunneling. Additionally, the three dimensional NAND string of the present embodiment has both excellent short term data retention and long term data retention. Further, the inventors have discovered that the three dimensional NAND string of the present embodiment may store four or more bits of information per memory cell.

Although the foregoing refers to particular preferred embodiments, it will be understood that the invention is not so limited. It will occur to those of ordinary skill in the art that various modifications may be made to the disclosed embodiments and that such modifications are intended to be within the scope of the invention. All of the publications, patent applications and patents cited herein are incorporated herein by reference in their entirety.

What is claimed is:

1. A method of making a monolithic three dimensional NAND string, comprising:
   providing a stack of alternating first material layers and second material layers different from the first material layer over a substrate, the stack comprising at least one opening containing a charge storage material comprising a silicide layer, a tunnel dielectric on the charge storage material in the at least one opening, and a semiconductor channel on the tunnel dielectric in the at least one opening;
   selectively removing the second material layers without removing the first material layers from the stack; and
   forming control gates between the first material layers.

2. The method of claim 1, further comprising forming a blocking dielectric between the first material layers and a sidewall of the charge storage material exposed between the first material layers.

3. The method of claim 2, further comprising forming a cut area on a back side of stack.

4. The method of claim 3, wherein: the second material layers are selectively removed through the cut area; the blocking dielectric is formed through the cut area such that the blocking dielectric contacts the sidewall of the charge storage material exposed between the first material layers; and the control gates are formed through the cut area.

5. The method of claim 4, wherein portions of the blocking dielectric between the first material layers have a clam shape, and wherein each of the control gates is located at least partially in an opening in a respective clam-shaped portion of the blocking dielectric.

6. The method of claim 4, wherein the charge storage material comprises a floating gate material.

7. The method of claim 6, wherein the floating gate material further comprises polysilicon.

8. The method of claim 7, wherein: the first material layers comprise insulating layers;
   the second material layers comprise second polysilicon layers; and
   the step of selectively removing the second material layers comprises partially removing the second polysilicon layers through the cut area prior to forming the blocking dielectric and the control gates.

9. The method of claim 8, further comprising forming a first polysilicon layer through the at least one opening.

10. The method of claim 9, further comprising:
    removing a portion of the second polysilicon layers located between the first material layers through the at least one opening to form front side recesses between the first material layers in the at least one opening;
    depositing a metal layer through the at least one opening on edge portions of the second polysilicon layers exposed in the front side recesses;
    heating the metal layer to react portions of the metal layer with the edge portions of the second polysilicon layers exposed in the front side recesses to form the silicide layer on remaining portions of the second polysilicon layers;
    selectively removing unreacted portions of the metal layer through the at least one opening; and
    depositing the first polysilicon layer on the silicide layer through the at least one opening.

11. The method of claim 10, wherein the silicide layer forms discrete charge storage segment portions of the floating gates which fill back portions of the front side recesses and the first polysilicon layer fills front portions of the front side recesses.

12. The method of claim 11, further removing second portions of the first polysilicon layer located in the at least one opening outside the front side recesses such that the second polysilicon layers, the silicide layer and first portions of the first polysilicon layer remaining in the front side recesses form discrete, vertically separated polysilicon-silicide-polysilicon floating gates.

13. The method of claim 12, wherein the step of providing the stack comprises:
    etching the stack to form the at least one opening in the stack;
    forming the tunnel dielectric on the charge storage material in the at least one opening; and
    forming the semiconductor channel on the tunnel dielectric in the at least one opening.

14. The method of claim 13, wherein:
    the NAND string is configured to store at least four bits per cell;
    the step of forming the tunnel dielectric occurs after the steps of depositing the metal layer, heating the metal layer, selectively removing unreacted portions of the metal layer, depositing the first polysilicon layer, and removing second portions of the first polysilicon layer;
    the semiconductor channel extends substantially perpendicular to a major surface of the substrate;
    the NAND string comprises a plurality of device levels over the substrate;
    the NAND string is vertically oriented, such that at least one memory cell is located over another memory cell in the NAND string; and
    each of the plurality of device levels comprises a respective control gate, a respective blocking dielectric portion adjacent to the respective control gate, a respective charge storage material portion adjacent to respective blocking dielectric portion, a respective tunnel dielectric portion adjacent to the respective charge storage material portion, and a respective portion of the semiconductor channel.

15. The method of claim 14, furthering comprising forming an upper electrode over the semiconductor channel and forming a lower electrode below the semiconductor channel.

16. The method of claim 1, wherein the control gates comprise conductive or semiconductor control gate material.

17. The method of claim 16, wherein the control gates comprise tungsten, copper, aluminum, tantalum, titanium, cobalt, titanium nitride or alloys thereof, and wherein the silicide layer comprises nickel, titanium, cobalt or tungsten silicide.

18. The method of claim 17, wherein the control gates comprise tungsten.

19. The method of claim 1, wherein the semiconductor channel in the at least one opening completely fills the at least one opening with a semiconductor channel material.

20. The method of claim 1, wherein the semiconductor channel in the at least one opening forms a semiconductor channel material on a sidewall of the tunnel dielectric but not in a central part of the at least one opening such that the semiconductor channel material does not completely fill the at least one opening, and further comprising forming an insulating fill material in the central part of the at least one opening to completely fill the at least one opening.

* * * * *